US012610526B2

(12) United States Patent
Li

(10) Patent No.: US 12,610,526 B2
(45) Date of Patent: Apr. 21, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei City (CN)

(72) Inventor: Songyu Li, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 650 days.

(21) Appl. No.: 17/808,891

(22) Filed: Jun. 24, 2022

(65) Prior Publication Data

US 2023/0292487 A1 Sep. 14, 2023

Related U.S. Application Data

(63) Continuation of application No. PCT/CN2022/081555, filed on Mar. 17, 2022.

(30) Foreign Application Priority Data

Mar. 8, 2022 (CN) .......................... 202210228820.0

(51) Int. Cl.
*H10B 12/00* (2023.01)
(52) U.S. Cl.
CPC ......... *H10B 12/312* (2023.02); *H10B 12/482* (2023.02); *H10B 12/485* (2023.02)
(58) Field of Classification Search
CPC .. H10B 12/312; H10B 12/482; H10B 12/485; H10B 12/315; H10B 12/0335
See application file for complete search history.

(56) References Cited

U.S. PATENT DOCUMENTS

| | | | | |
|---|---|---|---|---|
| 11,164,816 | B2 | 11/2021 | Huang | |
| 2013/0052780 | A1* | 2/2013 | Kim | H10B 12/485 |
| | | | | 257/E21.409 |
| 2020/0083055 | A1* | 3/2020 | Kim | H10B 12/482 |
| 2021/0074639 | A1 | 3/2021 | Huang | |
| 2021/0375763 | A1 | 12/2021 | Huang | |
| 2022/0149048 | A1* | 5/2022 | Rhee | H10B 12/315 |

FOREIGN PATENT DOCUMENTS

| | | |
|---|---|---|
| CN | 105448919 A | 3/2016 |
| CN | 110571190 A | 12/2019 |
| CN | 111192876 A | 5/2020 |
| CN | 113035872 A | 6/2021 |
| CN | 113690187 A | 11/2021 |
| WO | 2022042022 A1 | 3/2022 |

* cited by examiner

*Primary Examiner* — Eva Y Montalvo
(74) *Attorney, Agent, or Firm* — Syncoda LLC; Feng Ma

(57) ABSTRACT

A semiconductor structure includes a substrate, a barrier layer covering the substrate, first adjustment layers, and first contact structures. The substrate includes multiple spaced Active Areas (AAs). The AAs include first contact areas. The barrier layer is provided with multiple spaced first contact holes, each of which penetrates through the barrier layer and extends into the substrate to expose a respective one of the first contact areas. Each of the first adjustment layers is on a sidewall of a respective one of the first contact holes. Each of the first contact structures fills a respective region enclosed by the first adjustment layer and the first contact area. A method for manufacturing a semiconductor structure is also provided.

18 Claims, 19 Drawing Sheets

700

600

100

SEMICONDUCTOR STRUCTURE AND METHOD FOR MANUFACTURING SEMICONDUCTOR STRUCTURE

CROSS-REFERENCE TO RELATED APPLICATIONS

This application is a continuation of International Patent Application No. PCT/CN2022/081555 filed on Mar. 17, 2022, which claims priority to Chinese Patent Application No. 202210228820.0 filed on Mar. 8, 2022. The disclosures of these applications are hereby incorporated by reference in their entirety.

BACKGROUND

With the development of semiconductor technologies, semiconductor structures have been applied to various electronic devices extensively. Critical dimensions of semiconductor structures are reduced constantly so as to meet requirements for miniaturization and integration levels of electronic devices.

SUMMARY

The disclosure relates to the technical field of semiconductors, and particularly to a semiconductor structure and a method for manufacturing the semiconductor structure.

A first aspect of the disclosure provides a semiconductor structure, which includes a substrate, a barrier layer covering the substrate, first adjustment layers, and first contact structures. The substrate includes multiple spaced Active Areas (AAs). The AAs include first contact areas. The barrier layer is provided with multiple spaced first contact holes, each of which penetrates through the barrier layer and extends into the substrate to expose a respective one of the first contact areas. Each of the first adjustment layers is located on a sidewall of a respective one of the first contact holes. Each of the first contact structures fills a respective region enclosed by the first adjustment layer and the first contact area.

A second aspect of the disclosure provides a method for manufacturing a semiconductor structure, which includes the following operations. A substrate is provided, the substrate including multiple spaced AAs, and the AAs including first contact areas. The substrate is removed partially to form multiple spaced first contact holes, each of the first contact holes exposing a respective one of the first contact areas. A respective adjustment layer is formed on a sidewall of each of the first contact holes. A first contact structure is formed on a surface of the first adjustment layer as well as the first contact area.

DETAILED DESCRIPTION

With the reduction of a critical dimension of a semiconductor structure, particularly when the critical dimension is less than or equal to 28 nm, an on-state current of the semiconductor structure is reduced, and thus the performance of the semiconductor structure is affected. The inventor finds by researches that, this is because with the reduction of the critical dimension, Short Channel Effects (SCEs) occur in the semiconductor structure, particularly in a transistor. The SCEs include the reduction of a threshold voltage with the reduction of a channel length, Drain Induced Barrier Lowering (DIBL), carrier surface scattering, velocity saturation, ionization, hot electron effects, etc. They reduce the capability of a gate electrode in controlling a potential distribution and current flow in a channel region, thereby reducing an on-state current of the semiconductor structure.

In a semiconductor structure provided in the embodiments of the disclosure, first contact holes are formed in a substrate and a barrier layer thereon. The first contact holes expose first contact areas of the substrate. First adjustment layers are arranged on sidewalls of the first contact holes. First contact structures at least fill regions enclosed by the first adjustment layers and the first contact holes. A layer of atoms in contact with the first adjustment layer in the first contact structure generate a tensile stress or a compressive stress in the first contact structure for adaptation to the first adjustment layer.

The tensile stress or the compressive stress decomposes an original six-fold degeneracy energy valley of the atoms in the first contact structure into a four-fold degeneracy energy valley with increased energy and a two-fold degeneracy energy valley with decreased energy. The resulting energy splitting reduces the probability of energy valley scattering between the four-fold degeneracy energy valley and the two-fold degeneracy energy valley, and improves the electron mobility of the first contact structure. Therefore, an on-state current of the first contact structure is improved, and the performance of the semiconductor structure is further improved.

In order to make the above objectives, features, and advantages of the embodiments of the disclosure clearer and easier to understand, the technical solutions in the embodiments of the disclosure will be described clearly and completely below in combination with the drawings in the embodiments of the disclosure. It is apparent that the described embodiments are not all but only part of embodiments of the disclosure. All other embodiments obtained by those of ordinary skill in the art based on the embodiments in the disclosure without creative work shall fall within the scope of protection of the disclosure.

Figure 1:
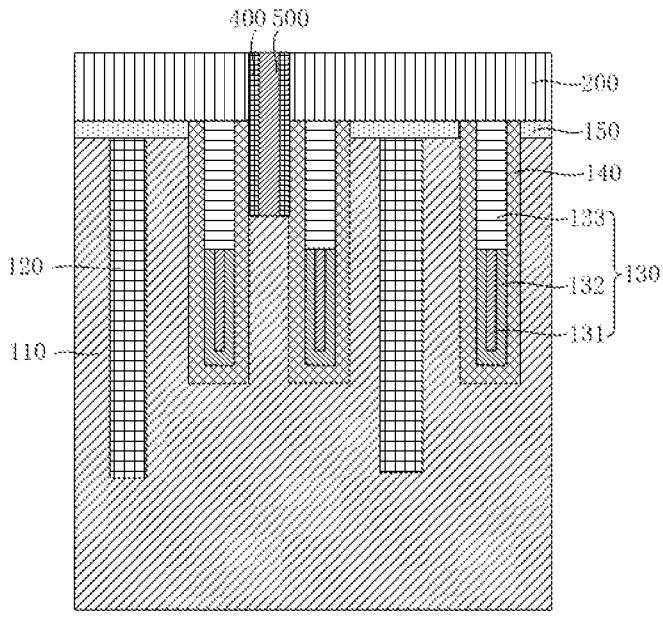
FIG. 1 is a schematic diagram of a semiconductor structure according to an embodiment of the disclosure.
Figure 2:
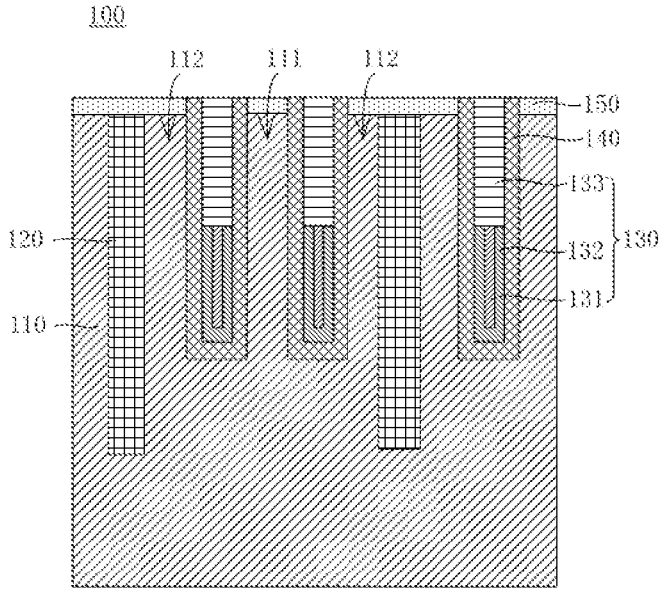
FIG. 2 is a schematic diagram of a substrate according to an embodiment of the disclosure.

Referring to FIG. 1 and FIG. 2, a semiconductor structure in an embodiment of the disclosure includes a substrate 100, a barrier layer 200, first adjustment layers 400, and first contact structures 500. As shown in FIG. 2, the substrate 100 includes multiple active areas (AAs) 110. The multiple AAs 110 are spaced. Exemplarily, Shallow Trench Isolation (STI) structures 120 may be arranged among the multiple AAs 110. The multiple AAs 110 are spaced by the STI structures 120, thereby ensuring that the AAs 110 are independent of one another.

Specifically, shallow trenches are formed in an initial substrate, and are filled with an insulating material (such as silicon oxide), thereby forming the multiple AAs 110 spaced by the STI structures 120. A material of the initial substrate may be a semiconductor material, such as silicon, germanium, silicon carbide, and silicon germanium. Alternatively, the initial substrate may be a Germanium on Insulator (GOI) substrate, a Silicon on Insulator (SOI) substrate, or the like.

Still referring to FIG. 1 and FIG. 2, the AA 110 includes a first contact area 111 (shown in FIG. 2). The first contact area 111 is electrically connected with the first contact structure 500, so as to be electrically connected with another structure, such as a bit line, through the first contact structure 500. The first contact area 111 may contact with the first contact structure 500. As shown in FIG. 1, an upper surface of the first contact area 111 contacts with a lower surface of the first contact structure 500, so as to implement electrical connection therebetween.

In some possible implementations, as shown in FIG. 2, the AA 110 further includes a second contact area 112. The first contact area 11 is spaced from the second contact area 112 by a word line 130. Specifically, the word lines 130 are formed in the substrate 100. The word line 130 intersects with the AA 110, thereby dividing the AA 110 into the first contact area 111 and the second contact area 112. That is, an extension direction of the word line 130 is at an included angle to that of the AA 110. The first contact area 111 and the second contact area 112 are on two sides of the word line 130 respectively, and are insulated from the word line 130. One of the first contact area 111 and the second contact area 112 may be used as a source region of a transistor, and the other of the first contact area 111 and the second contact area 112 may be used as a drain region of the transistor. Part of the word line 130 may be used as a gate of the transistor. With the arrangement of the buried word line 130, the integrity of the transistor may be improved, and the device characteristic of the transistor may be improved.

In a possible implementation, the word line 130 includes a first conductive layer 131, a second conductive layer 132, and a cap layer 133, which are sequentially stacked. A material of the first conductive layer 131 may be a metal, such as molybdenum and tungsten. A material of the second conductive layer 132 may be polycrystalline silicon. A value of the height of the first conductive layer 131 is greater than that of the second conductive layer 132. By such a setting, on one hand, the resistance of a stacked layer formed by the first conductive layer 131 and the second conductive layer 132 may be reduced by utilizing the lower work function of the polycrystalline silicon. That is, the resistance of the stacked layer formed by the first conductive layer 131 and the second conductive layer 132 is lower than that of the first conductive layer 131 at the same height. On the other hand, the height of the second conductive layer 132 is relatively small, so that an aspect ratio and/or capacitance of the stacked layer formed by the first conductive layer 131 and the second conductive layer 132 may be prevented from being increased. The cap layer 133 is configured to isolate and protect the second conductive layer 132 so as to prevent the second conductive layer 132 from being oxidized, and a material thereof may be silicon nitride or silicon oxynitride.

In another possible implementation, as shown in FIG. 2, the word line 131 includes a first conductive layer 131, a second conductive layer 132 covering a lateral surface and bottom surface of the first conductive layer 131, and a cap layer 133 arranged on the first conductive layer 131 and the second conductive layer 132. That is, the first conductive layer 131 is arranged in a region enclosed by the second conductive layer 132 and the cap layer 133. A material of the first conductive layer 131 may be a metal, such as molybdenum, tungsten, copper, and aluminum, etc. The second conductive layer 132 is used as a diffusion barrier layer to prevent the metal in the first conductive layer 131 from being diffused into another structure, and may be made of titanium nitride, etc. The cap layer 133 is configured to isolate and protect the second conductive layer 132 so as to prevent the second conductive layer 132 from being oxidized, and a material thereof may be silicon nitride or silicon oxynitride.

In the above-mentioned two implementations, a second insulating layer 140 is further arranged between the word line 130 and the substrate 100. A part of the second insulating layer 140 contacts with the AA 110, and the other part of the second insulating layer 140 contacts with the STI structure 120. By such a setting, on one hand, the insulation between the word line 130 and the substrate 100 may be ensured. On the other hand, the part of second insulating layer 140 contacting with the AA 110 may also be used as a gate dielectric layer. A material of the second insulating layer 140 may be silicon oxide, hafnium oxide, zirconia, alumina, etc.

Still referring to FIG. 1 and FIG. 2, the barrier layer 200 covers the substrate 100, and a material thereof may be silicon nitride. In some possible embodiments, the substrate 100 may further include a third insulating layer 150 covering the AAs 110 and the STI structures 120. The third insulating layer 150 isolates and protects the AAs 110. The word line 130 may be flush with the third insulating layer 150, and thus is convenient to manufacture.

Figure 9:
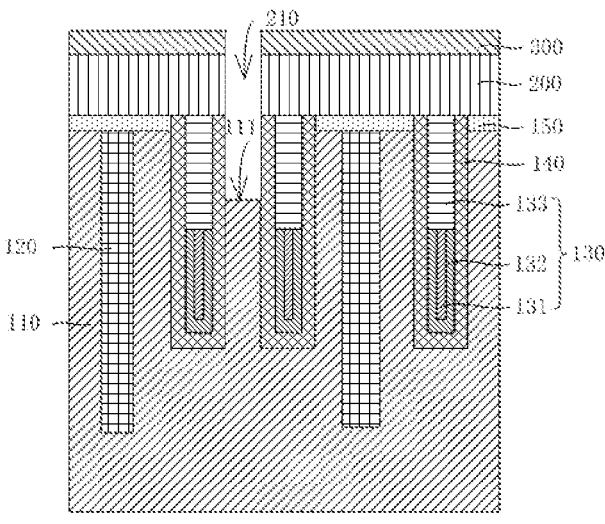
FIG. 9 is a schematic diagram after a first contact hole is formed according to an embodiment of the disclosure.

Multiple spaced first contact holes 210 are formed in the barrier layer 200 (referring to FIG. 9). Each of the first contact holes 210 penetrates through the barrier layer 200 and extends into the inside of the substrate 100, such that each of the first contact holes 210 exposes one first contact area 111, and a structure (such as the first contact structure 500) formed in the first contact hole 210 contacts with the first contact area 111 to implement electrical connection. Taking a plane parallel to the substrate 100 as a cross-section, a cross-sectional shape of the first contact hole 210 may be a round, an ellipse, a square, a rectangle, etc. The first contact holes 210 may be distributed in a hexagonal close packing manner or in an array.

Still referring to FIG. 1, the first adjustment layer 400 is on a sidewall of the first contact hole 210. The first adjustment layer 400 covers the sidewall of the first contact hole 210, and exposes a bottom wall of the first contact hole 210 partially. A surface of the first adjustment layer 400 facing away from the substrate 100 may be flush with that of the barrier layer 200 facing away from the substrate 100 to facilitate the formation of the first adjustment layer 400. The first contact area 111 is also exposed from a region enclosed by the first adjustment layer 400. A thickness of the first adjustment layer 400 ranges from 4 nm to 6 nm.

Still referring to FIG. 1 and FIG. 2, the first contact structure 500 fills a region enclosed by the first adjustment layer 400 and the first contact area 111. For example, the first contact structure 500 may fill and level up this region, such that a surface of the first contact structure 500, a surface of the first adjustment layer 400, and a surface of the barrier layer 200 are flush. Therefore, the three surfaces form a relatively flat plane on which other structures may be formed conveniently.

In a possible embodiment of the disclosure, a lattice constant of the first contact structure 500 is different from that of the first adjustment layer 400. By such a setting, a layer of atoms in contact with the first adjustment layer 400 in the first contact structure 500 generate a tensile stress or a compressive stress for adaptation to the lattice constant of the first adjustment layer 400. The tensile stress or the compressive stress decomposes an original six-fold degeneracy energy valley of the atoms in the first contact structure 500 into a four-fold degeneracy energy valley with increased energy and a two-fold degeneracy energy valley with decreased energy. The resulting energy splitting reduces the probability of energy valley scattering between the four-fold degeneracy energy valley and the two-fold degeneracy energy valley, and improves the electron mobility of the first contact structure 500. Therefore, an on-state current of the first contact structure 500 is improved, and the performance of the semiconductor structure is further improved.

Figure 3:
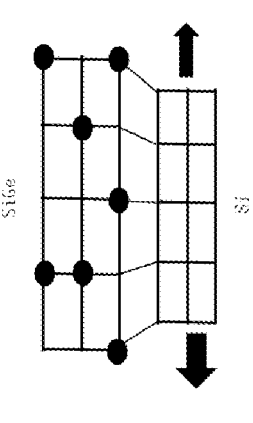
FIG. 3 is a schematic diagram of generating a tensile stress according to an embodiment of the disclosure.

Exemplarily, the lattice constant of the first contact structure 500 is less than that of the first adjustment layer 400. As shown in FIG. 3, atoms in the first contact structure 500 generate a tensile stress in the first contact structure 500 for adaptation to the lattice constant of the first adjustment layer 400. The tensile stress decomposes an original six-fold degeneracy energy valley 46 into a four-fold degeneracy energy valley 44 with increased energy and a two-fold degeneracy energy valley 42 with decreased energy. The resulting energy splitting may reduce the probability of energy valley scattering between 42 and 44, and improve the electron mobility. Therefore, the on-state current is improved.

In some possible implementations, the first adjustment layer 400, the first contact area 111, and the first contact structure 500 have the same IV-group element, such as silicon. By such a setting, the first contact structure 500 may be formed in the region enclosed by the first adjustment layer 400 and the first contact area 111 through an epitaxial growth process. The first contact structure 500 is combined with the first adjustment layer 400 more closely, and is subjected to a relatively high tensile stress or compressive stress.

Exemplarily, a material of the first contact area 111 is silicon. A material of the first adjustment layer 400 includes silicon germanium, silicon carbide, or silicon germanium carbide. A material of the first contact structure 500 is polycrystalline silicon, which may be doped polycrystalline silicon. For example, polycrystalline silicon is doped with N-type doped ions, such as phosphorus ions, through an ion implantation process.

When the first contact structure 500 uses Bit Line Contact (BLC), preferably, the material of the first adjustment layer 400 is silicon germanium, and the materials of the first contact area 111 and the first contact structure 500 are silicon. By such a setting, since a lattice constant of silicon germanium is greater than that of silicon, the first contact structure 500 is subjected to a tensile stress, a direction of the tensile stress being parallel to an extension direction of the first contact hole 210. Therefore, the electron mobility of the first contact structure 500 in the extension direction of the first contact hole 210 is improved, and the on-state current is improved.

The semiconductor structure in the embodiment of the disclosure further includes a bit line structure. The bit line structure includes multiple spaced bit lines located above the barrier layer 200 and extending in a first direction. The bit line is electrically connected with the first contact structure 500. An extension direction of the bit line is different from that of the word line 130. For example, the extension directions of the two are perpendicular to each other. In the first direction, the bit line is electrically connected with at least one of the first contact structures 500, and may be electrically connected with the first contact area 111 through the first contact structure 500. Specifically, each of the bit lines is connected with multiple first contact areas 111 in the same row. That is, multiple first contact areas 111 in the same row may be connected with the same bit line, and each of the first contact area 111 is connected only one bit line.

It can be understood that the extension direction of the bit line is at a certain angle to that of the AA 110. That is, the two extension directions are not parallel. Exemplarily, the BLC structure is arranged vertically, the multiple bit lines are parallel to one another, the AA 110 is inclined, and the multiple AAs 110 are parallel to one another. Therefore, the same bit line may be connected with multiple AAs 110.

The bit line may include a third conductive layer and a protective layer arranged on the third conductive layer. The third conductive layer contacts with the first contact structure 500. The third conductive layer may be a single layer or a stacked layer, and a material thereof may include an elemental metal or a metallic compound. The protective layer may be a silicon nitride layer or a silicon oxynitride layer.

Figure 4:
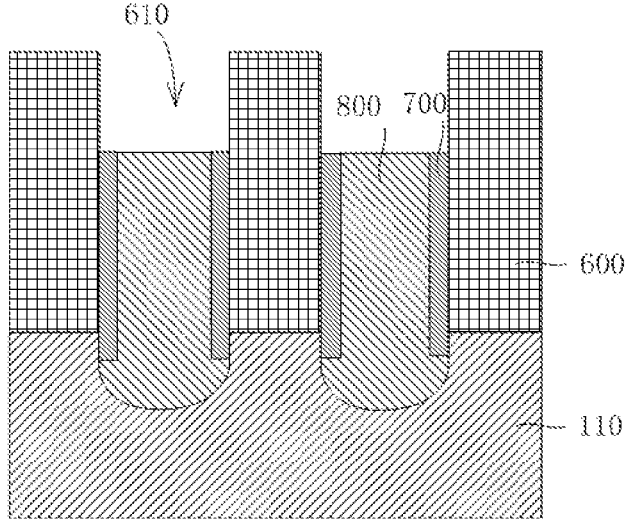
FIG. 4 is another schematic diagram of a semiconductor structure according to an embodiment of the disclosure.

Referring to FIG. 4, the semiconductor structure further includes an isolation layer 600, second contact holes 610, second adjustment layers 700, and second contact structures 800. The isolation layer 600 covers the bit line structure. The second contact holes 610 are formed in the isolation layer 600. The second contact hole 610 penetrates through the isolation layer 600 and the barrier layer 200 (referring to FIG. 4), and extends into the inside of the substrate 100 to expose a second contact area of the AA 110 on the substrate 100.

Specifically, multiple spaced second contact holes 610 are formed in the isolation layer 600. The multiple second contact holes 610 are located between two adjacent bit lines without exposing the bit lines. At least one second contact hole 610 is formed between every two adjacent bit lines. In some possible examples, the second contact holes 610 are distributed in an array. Multiple second contact holes 610 distributed in the first direction are formed between every two adjacent bit lines. Each of the second contact holes 610 exposes one second contact area 112. For example, the multiple second contact holes 610 are in one-to-one correspondence with the multiple second contact areas 112.

Still referring to FIG. 4, the second adjustment layer 700 is on a sidewall of the second contact hole 610. The second adjustment layer 700 at least covers the sidewall of the second contact hole 610 partially, and exposes a bottom wall of the second contact hole 610 partially. A surface of the second adjustment layer 700 may be flush with that of the isolation layer 600, or may be lower than that of the isolation layer 600. A thickness of the second adjustment layer 700 may range from 4 nm to 6 nm.

The second contact structure 800 fills a region enclosed by the second adjustment layer 700 and the second contact area 112. A lattice constant of the second contact structure 800 is different from that of the second adjustment layer 700. By such a setting, a layer of atoms in contact with the second adjustment layer 700 in the second contact structure 800 generate a tensile stress or a compressive stress for adaptation to the lattice constant of the second adjustment layer 700. The tensile stress or the compressive stress decomposes an original six-fold degeneracy energy valley of the atoms in the second contact structure 800 into a four-fold degeneracy energy valley with increased energy and a two-fold degeneracy energy valley with decreased energy. The resulting energy splitting reduces the probability of energy valley scattering between the four-fold degeneracy energy valley and the two-fold degeneracy energy valley, and improves the electron mobility of the second contact structure 800. Therefore, an on-state current of the second contact structure 800 is improved, and the performance of the semiconductor structure is further improved.

Figure 5:
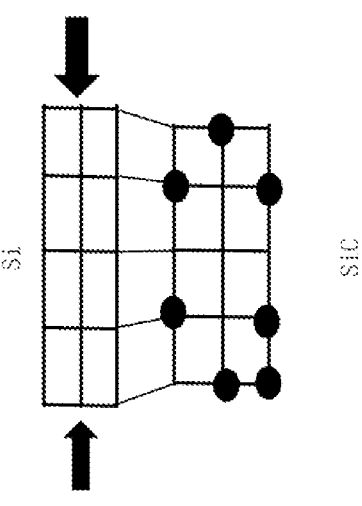
FIG. 5 is a schematic diagram of generating a compressive stress according to an embodiment of the disclosure.
Figure 6:
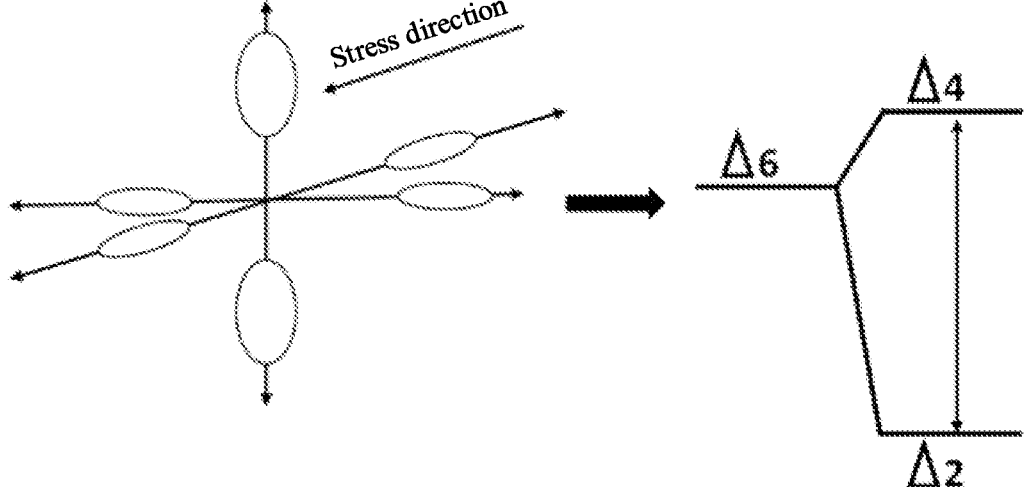
FIG. 6 is a schematic diagram of decomposing a six-fold degeneracy energy valley according to an embodiment of the disclosure.

Exemplarily, the lattice constant of the second contact structure 800 is greater than that of the second adjustment layer 700. As shown in FIG. 5, atoms in the second contact structure 800 generate a compressive stress for adaptation to the lattice constant of the second adjustment layer 700. Referring to FIG. 6, the compressive stress decomposes an original six-fold degeneracy energy valley 46 into a four-fold degeneracy energy valley 44 with increased energy and a two-fold degeneracy energy valley 42 with decreased energy. The resulting energy splitting may reduce the probability of energy valley scattering between 42 and 44, and improves the electron mobility. Therefore, the on-state current is improved.

In some possible implementations, the second adjustment layer 700, the second contact area 112, and the second contact structure 800 have the same IV-group element, such as silicon. By such a setting, the second contact structure 800 may be formed in the region enclosed by the second adjustment layer 700 and the second contact area 112 through an epitaxial growth process. The second contact structure 800 is combined with the second adjustment layer 700 more closely, and is subjected to a relatively high tensile stress or compressive stress.

Exemplarily, a material of the second contact area 112 is silicon. A material of the second adjustment layer 700 includes silicon germanium, silicon carbide, or silicon germanium carbide. A material of the second contact structure 800 is polycrystalline silicon. When the second contact structure 800 uses capacitive contact, preferably, the material of the second adjustment layer 700 is silicon carbide, and the materials of the second contact area 112 and the second contact structure 800 are silicon. By such a setting, since a lattice constant of silicon carbide is less than that of silicon, the second contact structure 800 is subjected to a compressive stress, a direction of the compressive stress being parallel to an extension direction of the second contact hole 610. Therefore, the electron mobility of the second contact structure 700 in the extension direction of the second contact hole 610 is improved, and the on-state current is improved.

Based on the embodiment where the semiconductor structure includes the first adjustment layer 400, the materials of the first adjustment layer 400 and the second adjustment layer 700 include silicon germanium, silicon carbide, or silicon germanium carbide, and the material of the second adjustment layer 700 is different from that of the first adjustment layer 400, such that the first adjustment layer 400 and the second adjustment layer 700 are adapted to the first contact structure 500 and the second contact structure 800 respectively. For example, the material of the first adjustment layer 400 may be silicon germanium, and the material of the second adjustment layer 700 may be silicon carbide. The thicknesses of both the first adjustment layer 400 and the second adjustment layer 700 range from 4 nm to 6 nm.

The semiconductor structure in the embodiment of the disclosure further includes a capacitor structure. The capacitor structure includes multiple spaced capacitors, each of which is electrically connected with each of the second contact structures 800 in one-to-one correspondence (namely each of the capacitors is electrically connected with a respective one of the second contact structures 800). The capacitor includes a top plate and bottom plate which are arranged oppositely, as well as a dielectric layer arranged between the top plate and the bottom plate. One of the top plate and the bottom plate contacts with the second contact structure 800, thereby electrically connecting the capacitor with the second contact area 112.

In summary, in the semiconductor structure provided in the embodiment of the disclosure, the substrate 100 includes the AAs 110. The AA 110 is provided with the first contact area 111. The multiple spaced first contact holes 210 are formed in the barrier layer 200 on the substrate 100. The first contact hole 210 extends into the inside of the substrate 100 so as to expose the first contact area 111. The first adjustment layer 400 is arranged on the sidewall of each of the first contact holes 210. The first contact structure 500 at least fills the region enclosed by the first adjustment layer 400 and the first contact area 111. A layer of atoms in contact with the first adjustment layer 400 in the first contact structure 500 generate a tensile stress or a compressive stress in the first contact structure 500 for adaptation to the first adjustment layer 400. The tensile stress or the compressive stress decomposes an original six-fold degeneracy energy valley of the atoms in the first contact structure 500 into a four-fold degeneracy energy valley with increased energy and a two-fold degeneracy energy valley with decreased energy. The energy splitting reduces the probability of energy valley scattering between the four-fold degeneracy energy valley and the two-fold degeneracy energy valley, and improves the electron mobility of the first contact structure 500. Therefore, an on-state current of the first contact structure 500 is improved, and the performance of the semiconductor structure is further improved.

Figure 7:
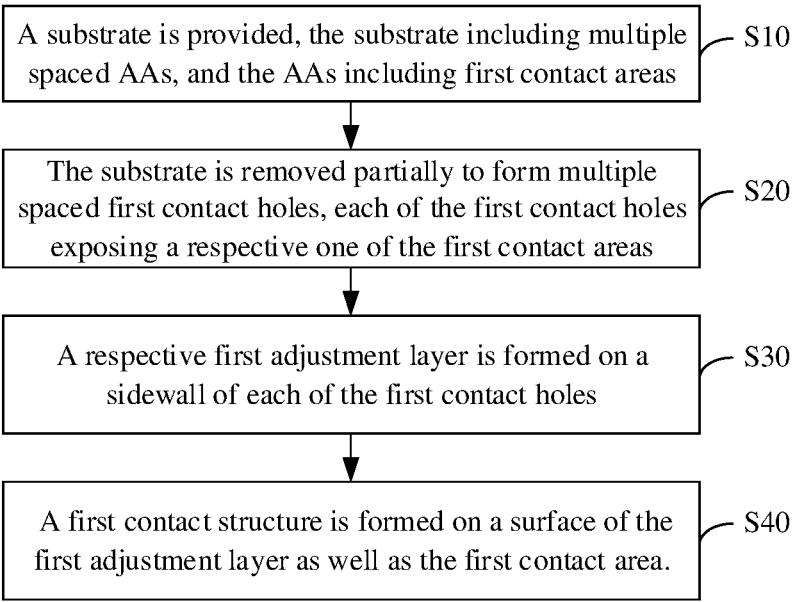
FIG. 7 is a flowchart of a method for manufacturing a semiconductor structure according to an embodiment of the disclosure.

An embodiment of the disclosure also provides a method for manufacturing a semiconductor structure. Referring to FIG. 7, the method for manufacturing the semiconductor structure includes the following operations.

In S10, a substrate is provided, the substrate including multiple spaced active areas (AAs), and the AAs including first contact areas.

Referring to FIG. 2, the substrate 100 includes multiple AAs 110. The multiple AAs 110 are spaced. Exemplarily, Shallow Trench Isolation (STI) structures 120 may be arranged among the multiple AAs 110. Specifically, shallow trenches are formed in an initial substrate, and are filled with an insulating material (such as silicon oxide), thereby forming the multiple AAs 110 spaced by the STI structures 120.

The AA 110 includes a first contact area 111. In some possible embodiments, the AA 110 further includes a second contact area 112. The first contact area 11 is spaced from the second contact area 112 by a word line 130. Specifically, the word lines 130 are formed in the substrate 100. The word line 130 intersects with the AA 110, thereby dividing the AA 110 into the first contact area 111 and the second contact area 112. That is, an extension direction of the word line 130 is at an included angle to that of the AA 110. The first contact area 111 and the second contact area 112 are on two sides of the word line 130 respectively, and are insulated from the word line 130. One of the first contact area 111 and the second contact area 112 may be used as a source region of a transistor, and the other of the first contact area 111 and the second contact area 112 may be used as a drain region of the transistor. Part of the word line 130 may be used as a gate of the transistor. Therefore, the integrity of a transistor is improved, and the device characteristic of the transistor is improved.

A second insulating layer 140 is further arranged between the word line 130 and the substrate 100. A part of the second insulating layer 140 contacts with the AA 110, and the other part of the second insulating layer 140 contacts with the STI structure 120. A material of the second insulating layer 140 may be silicon oxide, etc. By such a setting, on one hand, the insulation between the word line 130 and the substrate 100 may be ensured. On the other hand, the part of second insulating layer 140 contacting with the AA 110 may also be used as a gate dielectric layer.

In S20, the substrate is removed partially to form multiple spaced first contact holes, each of the first contact holes exposing a respective one of the first contact areas.

Figure 8:
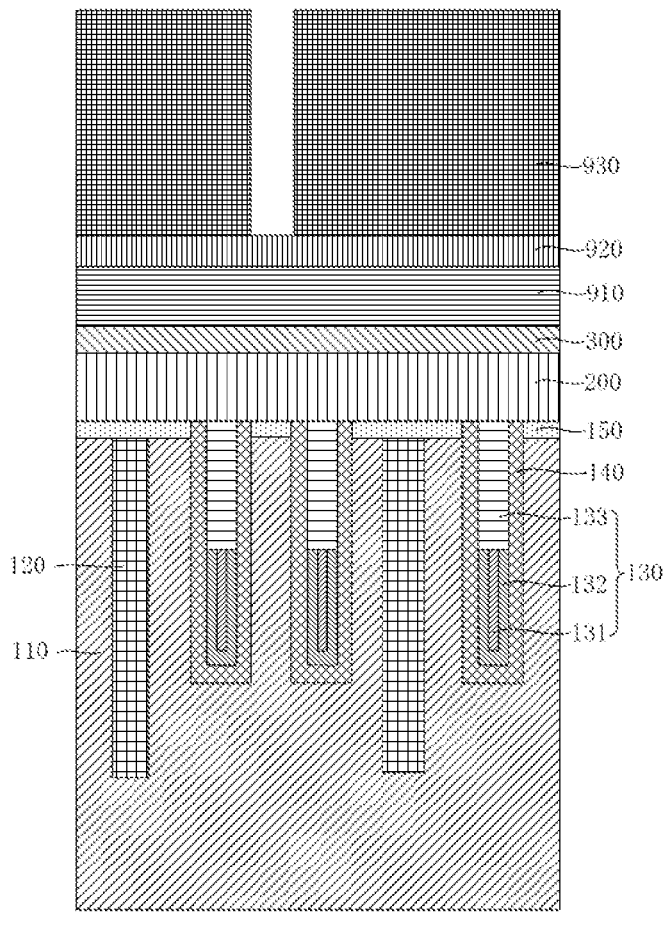
FIG. 8 is a schematic diagram after a photoresist (PR) layer is formed according to an embodiment of the disclosure.

Referring to FIG. 4, FIG. 8, and FIG. 9, the first contact holes 210 are formed in the substrate 100, and expose the first contact areas 111. The first contact holes 210 are in one-to-one correspondence with the first contact areas 111. In some possible implementations, the operation that the substrate 100 is removed partially to form multiple spaced first contact holes 210, each of the first contact holes 210 exposing a respective one of the first contact areas 111, includes the following operations.

A barrier layer 200 is formed on the substrate 100, the barrier layer 200 covering the substrate 100. Referring to FIG. 8, the barrier layer 200 is formed on the substrate 100, and covers the substrate 100, and a material thereof may be silicon nitride. The barrier layer 200 may be formed through a deposition process, such as a Chemical Vapor Deposition (CVD) process, a Physical Vapor Deposition (PVD) process, or an Atomic Layer Deposition (ALD) process.

In some possible embodiments, as shown in FIG. 8, the substrate 100 may further include a third insulating layer 150 covering the AAs 110 and the STI structure 120s. The third insulating layer 150 isolates and protects the AAs 110. A top surface of the word line 130 is flush with that of the third insulating layer 150. The barrier layer 200 covers the third insulating layer 150 and the word lines 130.

After the barrier layer 200 is formed, a first insulating layer 300 is formed on the barrier layer 200. Still referring to FIG. 8 and FIG. 9, the first insulating layer 300 is deposited and formed on the barrier layer 200, and covers the barrier layer 200. On one hand, the first insulating layer 300 may be used as a protective layer for the barrier layer 200, thereby reducing damages to the barrier layer 200 during subsequent treatment of a first contact structure 500 in a first contact hole 210. For example, when ion implantation is performed on the first contact structure 500, damages to the barrier layer 200 may be reduced. On the other hand, the first insulating layer 300 may be used as an etch stop layer for a structure formed thereon, thereby reducing damages to the barrier layer 200 when the structure on the first insulating layer is etched to further ensure the performance of the barrier layer 200. A material of the first insulating layer 300 may be oxide, such as silicon oxide. A thickness of the first insulating layer 300 ranges from 8 nm to 12 nm.

After the first insulating layer 300 is formed, the first insulating layer 300, the barrier layer 200, and the substrate 100 are removed partially to form the multiple spaced first contact holes 210. Referring to FIG. 8 and FIG. 9, the first insulating layer 300, the barrier layer 200, and the substrate 100 are etched through a dry etching or wet etching process, thereby forming the first contact holes 210. In some possible examples, the operation that the first insulating layer 300, the barrier layer 200, and the substrate 100 are removed partially to form the multiple spaced first contact holes 210 includes the following operations.

An Anti-Reflection Coating (ARC) layer 910, a mask layer 920, and a Photo Resist (PR) layer 930 are sequentially stacked on the first insulating layer 300. Referring to FIG. 8, the ARC layer 910 is formed on the first insulating layer 300, the mask layer 920 is formed on the ARC layer 910, and the PR layer 930 is formed on the mask layer 920.

Exposure, development, and other processes are performed on the PR layer 930 to form a required pattern. The mask layer 920 is configured to transfer the pattern in the PR layer 930, and is made from a relatively hard material capable of tolerating long-time etching with less damage, so that the accuracy of a pattern transfer process is ensured. The ARC layer 910 is configured to absorb light during the exposure of the PR layer 930, thereby reducing light reflection and further ensuring the accuracy of the pattern formed in the PR layer 930.

In some possible examples, a material of the mask layer 920 may be polycrystalline silicon. The mask layer 920 may be formed through a deposition process. The ARC layer 910 and the PR layer 930 may be formed through a spin-on process.

After the ARC layer 910, the mask layer 920, and the PR layer 930 are formed, the mask layer 920, the ARC layer 910, the first insulating layer 300, the barrier layer 200, and the substrate 100 are etched taking the PR layer 930 as a mask to form the first contact holes 210. Referring to FIG. 8 and FIG. 9, the mask layer 920 is etched taking the PR layer 930 as a mask to remove the mask layer 920 partially, thereby transferring the pattern of the PR layer 930 into the mask layer 920. Then, the ARC layer 910, the first insulating layer 300, the barrier layer 200, and the substrate 100 continue to be etched to form the first contact holes 210 in the first insulating layer 300, the barrier layer 200, and the substrate 100. The first contact hole 210 penetrates through the first insulating layer 300 and the barrier layer 200. A bottom wall of the first contact hole 210 is in the substrate 100.

Each film layer on the first insulating layer 300 is removed so as to expose the first insulating layer 300. Referring to FIG. 9, the ARC layer 910, the mask layer 920, and the PR layer 930 on the first insulating layer 300 may be removed through an etching process.

In some possible examples, during the process of etching the mask layer 920, the ARC layer 910, the first insulating layer 300, the barrier layer 200, and the substrate 100 by taking the PR layer 930 as a mask to form the first contact holes 210, at least one film layer away from the substrate 100 among the PR layer 930, a hard mask layer, and the ARC layer 910 is further removed. For example, during the process of forming the first contact holes 210, the PR layer 930 is removed. In such case, it is only necessary to remove the mask layer 920 and the ARC layer 910. That is, removing each film layer on the first insulating layer 300 refers to removing the ARC layer 910 and the mask layer 920 on the first insulating layer 300.

In some other examples, during the process of etching the mask layer 920, the ARC layer 910, the first insulating layer 300, the barrier layer 200, and the substrate 100 by taking the PR layer 930 as a mask to form the first contact holes 210, the PR layer 930 is removed partially. In such case, removing each film layer on the first insulating layer 300 refers to removing the ARC layer 910, the mask layer 920, and the PR layer 930 on the first insulating layer 300.

In S30, a respective first adjustment layer is formed on a sidewall of each of the first contact holes.

Figure 10:
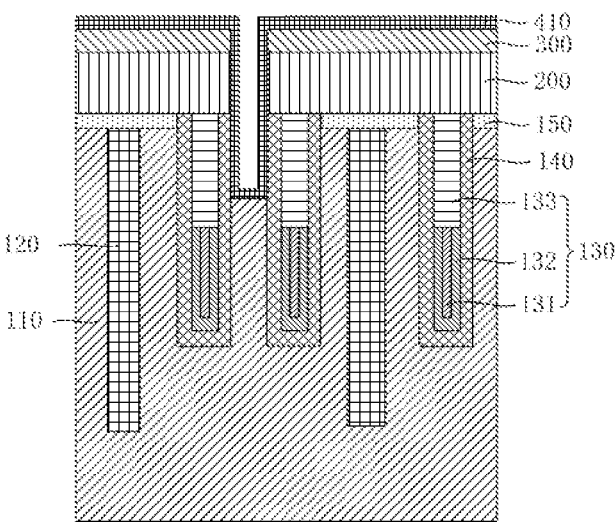
FIG. 10 is a schematic diagram after a first material layer is formed according to an embodiment of the disclosure.
Figure 11:
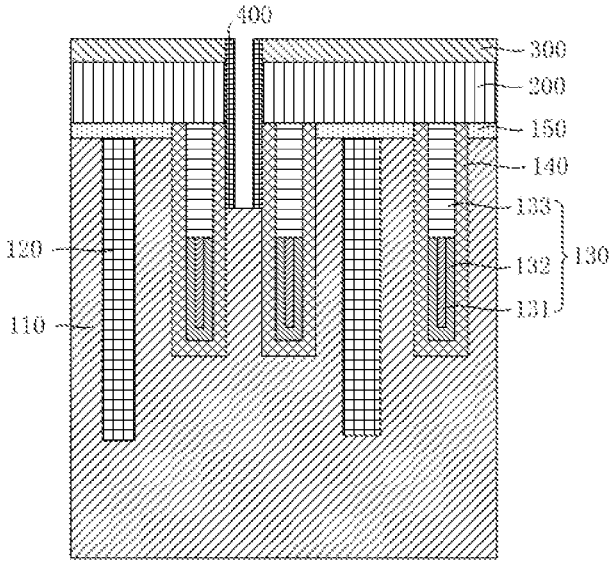
FIG. 11 is a schematic diagram after a first adjustment layer is formed according to an embodiment of the disclosure.

Referring to FIG. 9 to FIG. 11, the first adjustment layer 400 covers the sidewall of the first contact hole 210, and does not cover a bottom wall of the first contact hole 210. The first contact area 111 is exposed from a region enclosed by the first adjustment layer 400. A thickness of the first adjustment layer 400 ranges from 4 to 6 nm. Preferably, the thickness of the first adjustment layer 400 is 5 nm. A material of the first adjustment layer 400 may include silicon germanium, silicon carbide, silicon germanium carbide, or the like.

Referring to FIG. 9 to FIG. 11, in some possible implementations, the operation that the first adjustment layer 400 is formed on the sidewall of the first contact hole 210 includes the following operations.

A first material layer 410 is deposited on the sidewall and bottom wall of the first contact hole 210 as well as the first insulating layer 300. As shown in FIG. 9 and FIG. 10, the first material layer covers the sidewall and bottom wall of the first contact hole 210 as well as a surface of the first insulating layer 300 away from the substrate 100.

After the first material layer 410 is formed, the first material layer 410 is etched to remove the first material layer 410 on the bottom wall of the first contact hole 210 and the first insulating layer 300 to form the first adjustment layer 400. As shown in FIG. 10 and FIG. 11, the first material layer 410 is etched to retain the first material layer 410 on the sidewall of the first contact hole 210 and remove other parts of the first material layer 410, the retained first material layer 410 forming the first adjustment layer 400.

In S40, a first contact structure is formed on a surface of the first adjustment layer as well as the first contact area.

Referring to FIG. 1, the first contact structure 500 fills a region enclosed by the first adjustment layer 400 and the first contact area 111. For example, the first contact structure 500 may fill and level up this region, such that a surface of the first contact structure 500, a surface of the first adjustment layer 400, and a surface of the barrier layer 200 are flush. Therefore, the three surfaces form a relatively flat plane on which other structures may be formed conveniently.

In some possible implementations, the operation that the first contact structure 500 is formed on the surface of the first adjustment layer 400 as well as the first contact area 111 includes the following operation. The first contact structure 500 is grown epitaxially on the surface of the first adjustment layer 400 as well as the first contact area 111, a lattice constant of the first contact structure 500 being different from that of the first adjustment layer 400. The first adjustment layer 400, the first contact area 111, and the first contact structure 500 have the same IV-group element, such as silicon, thereby implementing the epitaxial growth of the first contact structure 500.

By such a setting, the first contact structure 500 is used as an epitaxial layer. Atoms of the first contact structure 500 combined with the first adjustment layer 400 generate a tensile stress or a compressive stress for adaptation to the lattice constant of the first adjustment layer 400. The tensile stress or the compressive stress decomposes an original six-fold degeneracy energy valley of the atoms in the first contact structure 500 into a four-fold degeneracy energy valley with increased energy and a two-fold degeneracy energy valley with decreased energy. The energy splitting reduces the probability of energy valley scattering between the four-fold degeneracy energy valley and the two-fold degeneracy energy valley, and improves the electron mobility of the first contact structure 500. Therefore, an on-state current of the first contact structure 500 is improved, and the performance of the semiconductor structure is improved.

When the first contact structure 500 uses Bit Line Contact (BLC), preferably, the material of the first adjustment layer 400 is silicon germanium, and the materials of the first contact area 111 and the first contact structure 500 are silicon. By such a setting, since a lattice constant of silicon germanium is greater than that of silicon, the first contact structure 500 is subjected to a tensile stress, a direction of the tensile stress being parallel to an extension direction of the first contact hole 210. Therefore, the electron mobility of the first contact structure 500 in the extension direction of the first contact hole 210 is improved, and the on-state current is improved.

Figure 12:
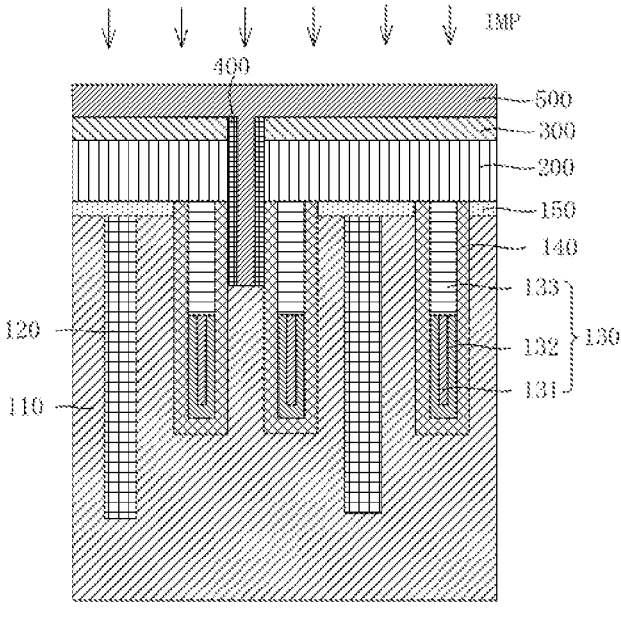
FIG. 12 is a schematic diagram after a first contact structure is formed according to an embodiment of the disclosure.

In some other possible implementations, referring to FIG. 12, the operation that the first contact structure 500 is formed on the surface of the first adjustment layer 400 as well as the first contact area 111 includes the following operation. The first contact structure 500 is grown epitaxially on the surface of the first adjustment layer 400, the surface of the first insulating layer 300, and the first contact area 111. The first adjustment layer 400, the first insulating layer 300, the first contact area 111, and the first contact structure 500 have the same IV-group element, such as silicon, thereby implementing the epitaxial growth of the first contact structure 500. Specifically, the material of the first adjustment layer 400 may be silicon germanium. The material of the first insulating layer 300 may be silicon oxide. A material of the first contact area 111 may be silicon. A material of the first contact structure 500 may be polycrystalline silicon. Referring to FIG. 12, after the first contact structure 500 is formed, ion implantation may further be performed on the first contact structure 500 to dope the first contact structure 500, thereby improving the performance of the first contact structure 500.

Figure 13:
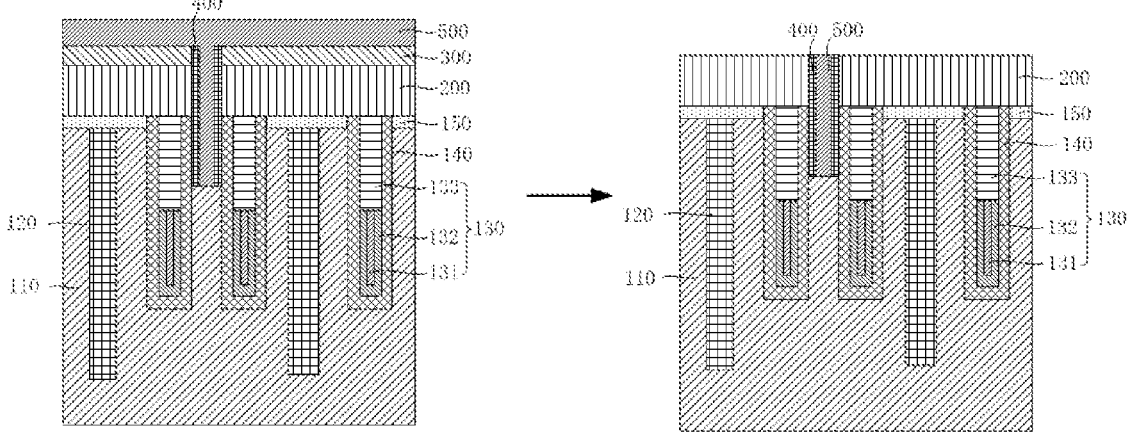
FIG. 13 is a schematic diagram after a first contact structure is removed partially according to an embodiment of the disclosure.

In the embodiment where the barrier layer 200 is formed on the substrate 100, after the operation that the first contact structure 500 is formed on the surface of the first adjustment layer 400 as well as the first contact area 111 (S40), the following operation may further be included. The first insulating layer 300 and first contact structure 500 above the barrier layer 200 are removed so as to expose the barrier layer 200. As shown in FIG. 13, the first insulating layer 300 and first contact structure 500 above the barrier layer 200 are removed through a planarization process.

In summary, in the method for manufacturing the semiconductor structure in the embodiment of the disclosure, the substrate 100 is removed partially to form the multiple spaced first contact holes 210. The first adjustment layer 400 is formed on the sidewall of the first contact hole 210. The first contact structure 500 is formed on the surface of the first adjustment layer 400 as well as the first contact area 111. As such, a layer of atoms in contact with the first adjustment layer 400 in the first contact structure 500 generate a tensile stress or a compressive stress for adaptation to the first adjustment layer 400. The tensile stress or the compressive stress decomposes an original six-fold degeneracy energy valley of the atoms in the first contact structure 500 into a four-fold degeneracy energy valley with increased energy and a two-fold degeneracy energy valley with decreased energy. The energy splitting reduces the probability of energy valley scattering between the four-fold degeneracy energy valley and the two-fold degeneracy energy valley, and improves the electron mobility of the first contact structure 500. Therefore, an on-state current of the first contact structure 500 is improved, and the performance of the semiconductor structure is further improved.

In some possible embodiments of the disclosure, after the operation that the first contact structure 500 is formed on the surface of the first adjustment layer 400 as well as the first contact area 111 (S40), the following operations are further included.

In S50, multiple spaced bit line structures are formed above the substrate, the first contact structure being electrically connected with the bit line structure.

The bit line structure includes multiple spaced bit lines extending in a first direction. The bit line is electrically connected with the first contact structure 500. In the first direction, the bit line is electrically connected with at least one of the first contact structures 500, and may be electrically connected with the first contact area 111 through the first contact structure 500. Specifically, each of the bit lines is connected with multiple first contact areas 111 in the same row. That is, multiple first contact areas 111 in the same row may be connected with the same bit line, and each of the first contact areas 111 is connected only one bit line.

The bit line may include a third conductive layer and a protective layer arranged on the third conductive layer. The third conductive layer contacts with the first contact structure 400. The third conductive layer may be a single layer or a stacked layer. The protective layer may be a silicon nitride layer or a silicon oxynitride layer.

In the embodiment where the barrier layer 200 is arranged on the substrate 100, the operation that multiple spaced bit line structures are formed above the substrate 100, the first contact structure 500 being electrically connected with the bit line structure, may include the following process. An initial third conductive layer and an initial protective layer are deposited on the barrier layer 200 and the first contact structure 500. The initial protective layer and the initial third conductive layer are etched, the remaining initial protective layer forms a protective layer, and the remaining initial third conductive layer forms a conductive layer, thereby forming multiple spaced bit lines.

In S60, a capacitor structure is formed above the bit line structure, the AA further including a second contact area, and the second contact area being electrically connected with the capacitor structure.

Specifically, the operation that the capacitor structure is formed above the bit line structure includes the following operations.

Figure 14:
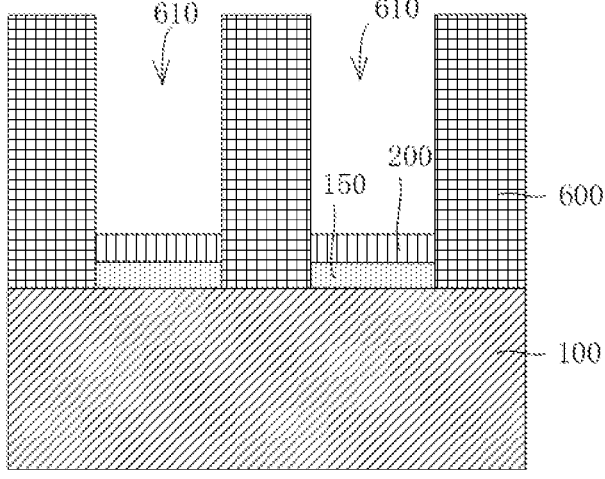
FIG. 14 is a schematic diagram after an isolation layer is formed according to an embodiment of the disclosure.
Figure 15:
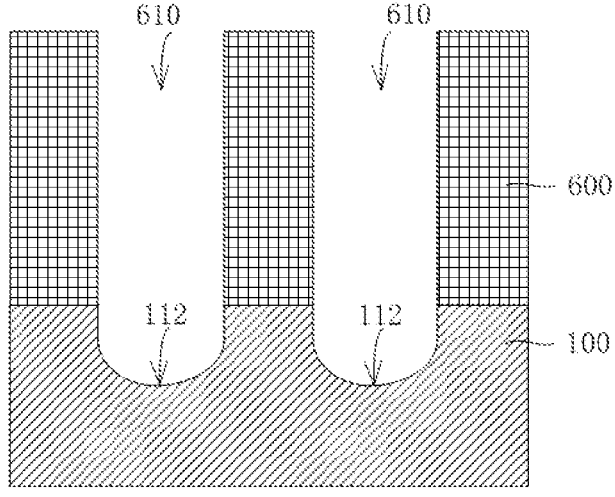
FIG. 15 is a schematic diagram after a second contact hole is formed according to an embodiment of the disclosure.

An isolation layer 600 is formed on bit lines, the isolation layer 600 covering the bit lines, a second contact hole 610 being formed between adjacent bit lines, and each of the second contact holes 610 exposing a respective one of the second contact areas 112. Referring to FIG. 14 and FIG. 15, an isolation layer 600 is deposited on bit lines. The isolation layer 600 covers the bit lines so as to isolate and protect the bit lines. The isolation layer 600 is provided with second contact holes 610. The second contact hole 610 are between adjacent bit lines, and do not expose the bit lines. The second contact hole 610 extends into the inside of the substrate 100 to expose the second contact area 112 on the substrate 100. Exemplarily, the second contact hole 610 penetrates through the isolation layer 600 and the barrier layer 200, and a bottom wall thereof is in the substrate 100. Therefore, the second contact area 112 is exposed.

Figure 16:
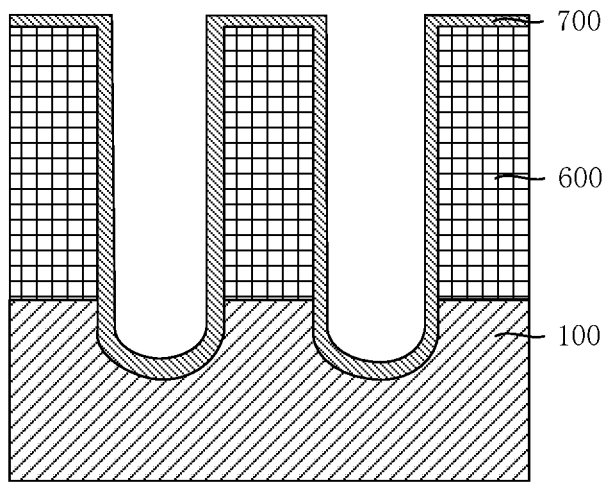
FIG. 16 is a schematic diagram after a second adjustment layer is formed according to an embodiment of the disclosure.
Figure 17:
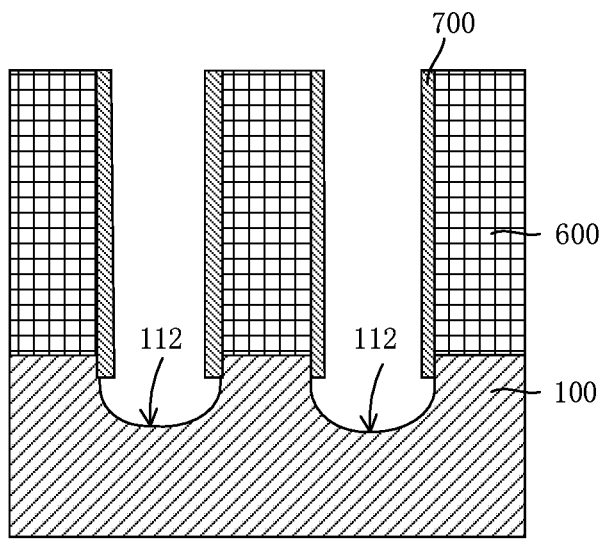
FIG. 17 is a schematic diagram after a second adjustment layer is removed partially according to an embodiment of the disclosure.

A second adjustment layer 700 is on a sidewall of the second contact hole 610. Referring to FIG. 16 and FIG. 17, exemplarily, a second adjustment layer 700 is deposited on the sidewall and bottom wall of the second contact hole 610 as well as the isolation layer 600. Then, the second adjustment layer 700 on the bottom wall of the second contact hole 610 and the isolation layer 600 is removed, with the second adjustment layer 700 on the sidewall of the second contact hole 610 being retained.

Figure 18:
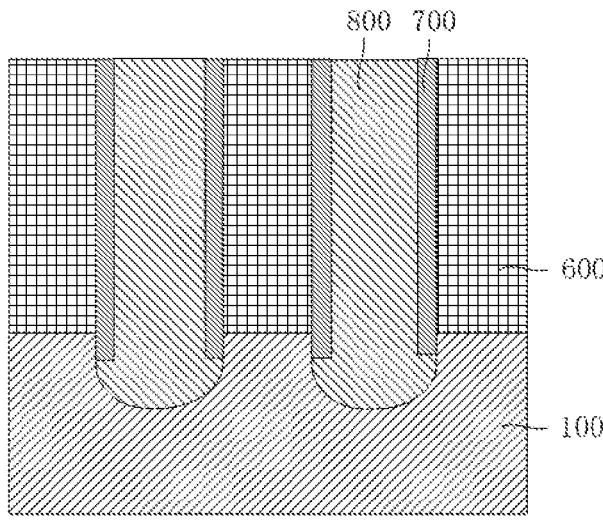
FIG. 18 is a schematic diagram after a second contact structure is formed according to an embodiment of the disclosure.

A second contact structure 800 is grown epitaxially on a surface of the second adjustment layer 700 as well as the second contact area 112, a lattice constant of the second contact structure 800 being different from that of the second adjustment layer 700. Referring to FIG. 17 and FIG. 18, a second contact structure 800 is formed on a surface of the second adjustment layer 700 as well as the second contact area 112 through an epitaxial growth process, the second contact structure 800 filling a region enclosed by the second adjustment layer 700 and the second contact area 112.

A lattice of the second contact structure 800 is different from that of the second adjustment layer 700. By such a setting, a layer of atoms in contact with the second adjustment layer 700 in the second contact structure 800 generate a tensile stress or a compressive stress for adaptation to the lattice constant of the second adjustment layer 700. The tensile stress or the compressive stress decomposes an original six-fold degeneracy energy valley of the atoms in the second contact structure 800 into a four-fold degeneracy energy valley with increased energy and a two-fold degeneracy energy valley with decreased energy. The energy splitting reduces the probability of energy valley scattering between the four-fold degeneracy energy valley and the two-fold degeneracy energy valley, and improves the electron mobility of the second contact structure 800. Therefore, an on-state current of the second contact structure 800 is improved, and the performance of the semiconductor structure is further improved.

In some possible implementations, the second adjustment layer 700, the second contact area 112, and the second contact structure 800 have the same IV-group element, such as silicon, thereby implementing the epitaxial growth of the second contact structure 800. Specifically, a material of the second adjustment layer 700 may be silicon carbide. A material of the second contact area 112 may be silicon. A material of the second contact structure 800 may be polycrystalline silicon. By such a setting, since a lattice constant of silicon carbide is less than that of silicon, the second contact structure 800 is subjected to a compressive stress, a direction of the compressive stress being parallel to an extension direction of the second contact hole 610. Therefore, the electron mobility of the second contact structure 700 in the extension direction of the second contact hole 610 is improved, and the on-state current is improved.

In the embodiment of the disclosure, the materials of the first adjustment layer 400 and the second adjustment layer 700 include silicon germanium, silicon carbide, silicon germanium carbide, or the like. The materials of the first adjustment layer 400 and the second adjustment layer 700 may be different. Thicknesses of both the first adjustment layer 400 and the second adjustment layer 700 range from 4 nm to 6 nm.

Figure 19:
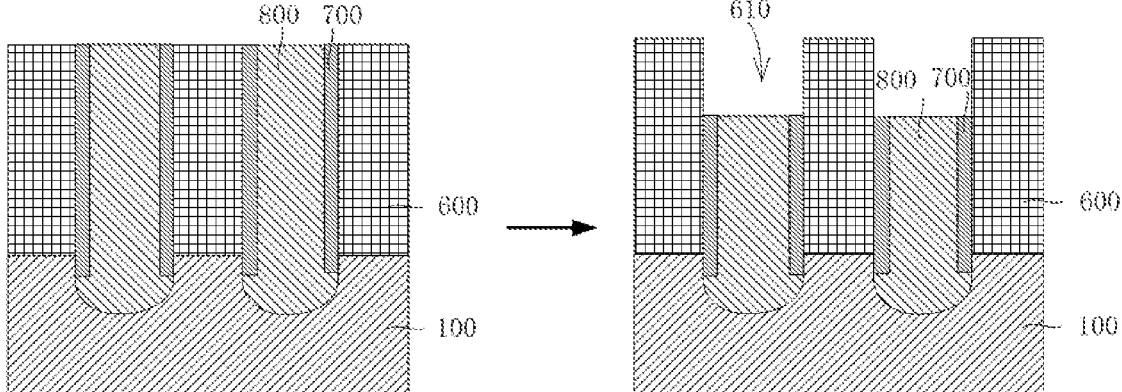
FIG. 19 is a schematic diagram after a second contact structure is removed partially according to an embodiment of the disclosure.

In some possible embodiments, referring to FIG. 19, after forming the second contact structure 800, the following operation is further included. The second adjustment layer 700 and the second contact structure 800 are removed partially such that a surface of the second contact structure 800 away from the substrate 100 is lower than that of the isolation layer 600 away from the substrate 100. By such a setting, electrical connections between the second contact structures 800 may be avoided, and the insulation therebetween may be ensured.

Each embodiment or implementation in the specification is described progressively. Descriptions made in each embodiment focus on differences from the other embodiments, and the same or similar parts in each embodiment refer to the other embodiments. The descriptions made with reference to terms "an implementation", "some implementations", "schematic implementation", "example", "specific example", "some examples", or the like refer to that specific features, structures, materials, or characteristics described in combination with the implementations or the examples are included in at least one implementation or example of the disclosure. In the specification, schematic expressions about these terms are not necessarily for the same implementations or examples. Moreover, the described specific features, structures, materials, or characteristics may be combined as appropriate in any one or more implementations or examples.

It is finally to be noted that each of the above embodiments is for describing rather than limiting the technical solutions of the disclosure. Although the disclosure is described with reference to each embodiment in detail, those of ordinary skill in the art should know that modifications may also be made to the technical solutions recorded in each embodiment or equivalent replacements may be made to part or all of technical features therein. These modifications or replacements do not make the essence of the corresponding technical solutions depart from the scope of the technical solutions of each embodiment of the disclosure.

What is claimed is:

1. A semiconductor structure, comprising a substrate, a barrier layer covering the substrate, first adjustment layers, and first contact structures, wherein the substrate comprises a plurality of spaced Active Areas (AAs), and the AAs comprise first contact areas; the barrier layer is provided with a plurality of spaced first contact holes, each of the first contact holes penetrates through the barrier layer and extends into the substrate to expose a respective one of the first contact areas;

each of the first adjustment layers is on a sidewall of a respective one of the first contact holes to expose a bottom wall of the first contact area; and the first adjustment layer extends into the substrate;

each of the first contact structures fills a respective region enclosed by the first adjustment layer and the first contact area; and a lattice constant of the first contact structure is less than a lattice constant of the first adjustment layer, atoms in the first contact structure generate a tensile stress in the first contact structure for adaptation to the lattice constant of the first adjustment layer.

2. The semiconductor structure of claim 1, further comprising a bit line structure, wherein the bit line structure comprises a plurality of spaced bit lines located above the barrier layer and extending in a first direction, and the bit lines are electrically connected with the first contact structures.

3. The semiconductor structure of claim 2, further comprising an isolation layer, second contact holes, second adjustment layers, and second contact structures, wherein the isolation layer covers the bit line structure; each of the second contact holes is located between two adjacent bit lines, penetrates through the isolation layer and the barrier layer, and extends into the substrate to expose a respective one of second contact areas in the AAs;

each of the second adjustment layers is on a sidewall of a respective one of the second contact holes to expose a bottom wall of the second contact area;

the second adjustment layer extends into the substrate;

each of the second contact structures fills a respective region enclosed by the second adjustment layer and the second contact area; and a lattice constant of the second contact structure is different from a lattice constant of the second adjustment layer; a layer of atoms in contact with the second adjustment layer in the second contact structure generate a tensile stress or a compressive stress for adaptation to the lattice constant of the second adjustment layer.

4. The semiconductor structure of claim 3, further comprising a capacitor structure, wherein the capacitor structure comprises a plurality of spaced capacitors, each of the capacitors is electrically connected with a respective one of the second contact structures.

5. The semiconductor structure of claim 3, wherein materials of the first adjustment layer and the second adjustment layer comprise silicon germanium, silicon carbide, or silicon germanium carbide.

6. The semiconductor structure of claim 3, wherein thicknesses of the first adjustment layer and the second adjustment layer range from 4 nm to 6 nm; and a material of the second adjustment layer is different from a material of the first adjustment layer.

7. The semiconductor structure of claim 3, further comprising a plurality of word lines, the first contact area and the second contact area are one two sides of a word line the plurality of word lines.

8. The semiconductor structure of claim 7, wherein the word line comprises a first conductive layer, a second conductive layer and a cap layer, wherein the second conductive layer covers a lateral surface and bottom surface of the first conductive, the cap layer arranges on the first conductive layer and the second conductive layer.

9. The semiconductor structure of claim 8, wherein a value of a height of the first conductive layer is greater than a value of a height of the second conductive layer.

10. The semiconductor structure of claim 8, wherein material of the first conductive layer comprises molybdenum or tungsten, material of the second conductive layer comprises polycrystalline silicon.

11. A semiconductor structure, comprising a substrate, comprises a plurality of spaced Active Areas (AAs);

a first contact hole, extends into the substrate to expose an Active Area (AA) of the AAs;

a first adjustment layer, arranges on a sidewall of the first contact hole to expose a bottom wall of the AA;

a first contact structure, contacts the first adjustment layer and the bottom wall of the AA to fill the first contact hole; and wherein a lattice constant of the first contact structure is less than a lattice constant of the first adjustment layer, atoms in the first contact structure generate a tensile stress in the first contact structure for adaptation to the lattice constant of the first adjustment layer.

12. A semiconductor structure, comprising a substrate, comprises a plurality of spaced Active Areas (AAs) and a plurality of Word Lines (WLs), a Word Line of the WLs intersects with an Active Area of the AAs, dividing the AA into a first contact area and a second contact area;

a first contact hole, extends into the substrate to expose a first contact area;

a second contact hole, extends into the substrate to expose a second contact area;

a first adjustment layer, arranges on a sidewall of the first contact hole to expose a bottom wall of the first contact hole;

a first contact structure, contacts the first adjustment layer and the bottom wall of the first contact hole to fill the first contact hole;

a second adjustment layer, arranges on a sidewall of the second contact hole to expose a bottom wall of the second contact hole;

a second contact structure, contacts the second adjustment layer and the bottom wall of the second contact hole to fill the second contact hole; and wherein a lattice constant of the first contact structure is less than a lattice constant of the first adjustment layer, atoms in the first contact structure generate a tensile stress in the first contact structure for adaptation to the lattice constant of the first adjustment layer; a lattice constant of the second contact structure is greater than a lattice constant of the second adjustment layer; atoms in the second contact structure generate a compressive stress for adaptation to the lattice constant of the second adjustment layer.

13. The semiconductor structure of claim 12, wherein the Word Line comprises a first conductive layer, a second conductive layer and a cap layer, wherein the second conductive layer covers a lateral surface and bottom surface of the first conductive, the cap layer arranges on the first conductive layer and the second conductive layer.

14. The semiconductor structure of claim 13, wherein a value of a height of the first conductive layer is greater than a value of a height of the second conductive layer.

15. The semiconductor structure of claim 13, wherein material of the first conductive layer comprises molybdenum or tungsten, material of the second conductive layer comprises polycrystalline silicon.

16. The semiconductor structure of claim 12, wherein materials of the first adjustment layer and the second adjustment layer comprise silicon germanium, silicon carbide, or silicon germanium carbide.

17. The semiconductor structure of claim 16, wherein a material of the second adjustment layer is different from a material of the first adjustment layer.

18. The semiconductor structure of claim 12, wherein thicknesses of the first adjustment layer and the second adjustment layer range from 4 nm to 6 nm.

* * * * *